US008809836B2

(12) United States Patent
Pillarisetty et al.

(10) Patent No.: US 8,809,836 B2
(45) Date of Patent: Aug. 19, 2014

(54) TECHNIQUES FOR FORMING CONTACTS TO QUANTUM WELL TRANSISTORS

(71) Applicants: Ravi Pillarisetty, Portland, OR (US); Benjamin Chu-Kung, Hillsboro, OR (US); Mantu K. Hudait, Portland, OR (US); Marko Radosavljevic, Beaverton, OR (US); Jack T. Kavalieros, Portland, OR (US); Willy Rachmady, Beaverton, OR (US); Niloy Mukherjee, Beaverton, OR (US); Robert S. Chau, Beaverton, OR (US)

(72) Inventors: Ravi Pillarisetty, Portland, OR (US); Benjamin Chu-Kung, Hillsboro, OR (US); Mantu K. Hudait, Portland, OR (US); Marko Radosavljevic, Beaverton, OR (US); Jack T. Kavalieros, Portland, OR (US); Willy Rachmady, Beaverton, OR (US); Niloy Mukherjee, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/758,974

(22) Filed: Feb. 4, 2013

(65) Prior Publication Data

US 2013/0146845 A1 Jun. 13, 2013

Related U.S. Application Data

(63) Continuation of application No. 12/646,621, filed on Dec. 23, 2009, now Pat. No. 8,368,052.

(51) Int. Cl.
  *H01L 29/66* (2006.01)
(52) U.S. Cl.
  USPC .............................. 257/24; 257/192; 257/411

(58) Field of Classification Search
  None
  See application file for complete search history.

(56) References Cited

U.S. PATENT DOCUMENTS

| 7,429,747 | B2 | 9/2008 | Hudait et al. |
| 7,435,987 | B1 | 10/2008 | Chui et al. |
| 7,494,862 | B2 | 2/2009 | Doyle et al. |
| 7,569,443 | B2 | 8/2009 | Kavalieros et al. |
| 7,569,869 | B2 | 8/2009 | Jin et al. |
| 7,601,980 | B2 | 10/2009 | Hudait et al. |
| 7,759,142 | B1 | 7/2010 | Majhi et al. |
| 7,892,902 | B1 * | 2/2011 | Hudait et al. ................. 438/172 |
| 8,115,235 | B2 | 2/2012 | Pillarisetty et al. |
| 2005/0018730 | A1 | 1/2005 | Taylor et al. |
| 2005/0023554 | A1 | 2/2005 | Chu et al. |
| 2005/0095763 | A1 | 5/2005 | Samavedam et al. |

(Continued)

FOREIGN PATENT DOCUMENTS

CN 101133498 A 2/2008

OTHER PUBLICATIONS

PCT/US2010/058683 International Search Report, dated Dec. 2, 2010, pages.

(Continued)

*Primary Examiner* — Minh-Loan T Tran
*Assistant Examiner* — Fazli Erdem
(74) *Attorney, Agent, or Firm* — Blakely, Sokoloff, Taylor & Zafman LLP

(57) ABSTRACT

Techniques are disclosed for providing a low resistance self-aligned contacts to devices formed in a semiconductor heterostructure. The techniques can be used, for example, for forming contacts to the gate, source and drain regions of a quantum well transistor fabricated in III-V and SiGe/Ge material systems. Unlike conventional contact process flows which result in a relatively large space between the source/drain contacts to gate, the resulting source and drain contacts provided by the techniques described herein are self-aligned, in that each contact is aligned to the gate electrode and isolated therefrom via spacer material.

8 Claims, 9 Drawing Sheets

(56) References Cited

U.S. PATENT DOCUMENTS

| | | |
|---|---|---|
| 2006/0148182 A1 | 7/2006 | Datta et al. |
| 2008/0038924 A1 | 2/2008 | Rachmady et al. |
| 2008/0116485 A1* | 5/2008 | Hudait et al. .............. 257/192 |
| 2008/0142786 A1 | 6/2008 | Datta et al. |
| 2008/0157130 A1 | 7/2008 | Chang |
| 2008/0203381 A1 | 8/2008 | Hudait et al. |
| 2008/0237573 A1 | 10/2008 | Jin et al. |
| 2008/0237577 A1 | 10/2008 | Chui et al. |
| 2009/0057648 A1 | 3/2009 | Hudait et al. |
| 2009/0242872 A1 | 10/2009 | Pillarisetty et al. |
| 2009/0242873 A1 | 10/2009 | Pillarisetty et al. |
| 2009/0283756 A1 | 11/2009 | Hellings et al. |
| 2010/0155701 A1* | 6/2010 | Radosavljevic et al. ........ 257/24 |
| 2011/0133168 A1* | 6/2011 | Dewey et al. ................ 257/24 |

OTHER PUBLICATIONS

Office Communication mailed May 21, 2011, U.S. Appl. No. 12/646,621, filed Dec. 23, 2009.

Office Communication mailed Nov. 8, 2011, U.S. Appl. No. 12/646,621, filed Dec. 23, 2009.

English translation of First Office Action dated Apr. 21, 2014 from Chinese Patent Application No. 201080058274.6 corresponding to U.S. Appl. No. 13/758,974.

* cited by examiner

TECHNIQUES FOR FORMING CONTACTS TO QUANTUM WELL TRANSISTORS

This is a Continuation Application of Ser. No.: 12/646,621 filed Dec. 23, 2009 which is hereby incorporated by reference.

BACKGROUND

Quantum well transistor devices formed in epitaxially grown semiconductor heterostructures, typically in III-V or silicon-germanium/germanium (SiGe/Ge) material systems, offer exceptionally high carrier mobility in the transistor channel due to low effective mass along with reduced impurity scattering due to delta doping. In addition, these devices provide exceptionally high drive current performance. Although, such devices can display high channel mobilities, forming source/drain contacts with low access resistance to the channel is quite difficult, especially in SiGe/Ge and III-V material systems.

DETAILED DESCRIPTION

Figure 1:
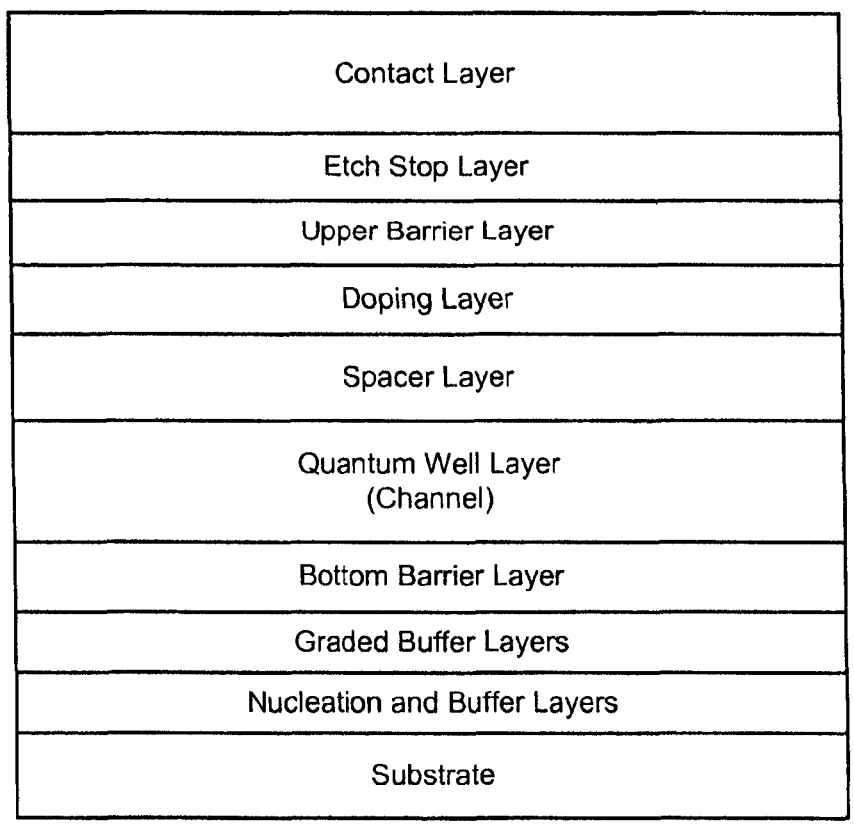
FIG. 1 illustrates an example quantum well growth structure for which low resistance self-aligned contacts can be formed, in accordance with one embodiment of the present invention.

Techniques are disclosed for providing a low resistance self-aligned contacts to devices formed in a semiconductor heterostructure. The techniques can be used, for example, for forming contacts to the source and drain regions of a quantum well transistor fabricated in III-V and SiGe/Ge material systems. Unlike conventional contact process flows which result in a relatively large open space between the contact and gate, the resulting source and drain contacts provided by the techniques described herein are self-aligned, in that each contact is aligned to the gate electrode.

General Overview

As previously stated, forming source/drain contacts with low access resistance to the channel of quantum well transistor devices is quite difficult and involves a number of non-trivial issues.

In short, conventional self-aligned contact schemes used in the semiconductor industry work poorly in III-V and SiGe/Ge quantum well devices. For instance, implanted source/drain regions form poor contacts to low carrier activation, and regrown source/drain schemes also suffer from low activation and junction quality. Quantum well devices typically use a doped capping layer to help improve this contact resistance. However, conventional contact flows using this cap layer are not self-aligned. Hence, there is a large degradation to layout density. Moreover, lower mobility devices, such as p-channel metal oxide semiconductor (PMOS) indium antimonide (InSb) or Ge quantum well devices, still have sufficient resistivity in the capping layers to cause significant degradation of the source/drain resistance (sometimes called the external resistance, or Rext, which generally refers to the sum of all of the resistance values in the device less the channel resistance).

Techniques provided herein can be used to form a low resistance self-aligned contact to quantum well device, including those implemented with III-V and SiGe/Ge material systems. The quantum well structure itself can be fabricated using any number of conventional or custom process flows, and may be configured as needed to suit the particulars of a given application. For instance, the quantum well structure can be a conventional indium gallium arsenide (InGaAs) N-type quantum well structure with an n+ doped capping layer. Alternatively, the quantum well structure can be a conventional indium antimonide (InSb) P-type quantum well structure. Numerous other suitable quantum well structure types and configurations will be apparent in light of this disclosure, and the claimed invention is not intended to be limited to any particular one or set.

Thus, given a desired quantum well structure, the gate and source/drain electrodes can then be formed in accordance with an embodiment of the present invention. So, in accordance with one example embodiment, self-aligned contact formation may generally include the growth of the underlying quantum well structure (or any portion thereof), prior to formation of the gate and source/drain electrodes. An alternative embodiment assumes the quantum well structure is pre-formed.

In any case, once the pre-electrode formation quantum well structure is provided, this example embodiment of the method includes performing mesa isolation, where an active area of the structure is masked and the unmasked material is etched away, thereby effectively forming a mesa. A dielectric material such as silicon dioxide ($SiO_2$) is then deposited into the etched areas around the mesa to provide electrical isolation. The example method further includes deposition and patterning of source/drain metal over the active transistor device, so as to form a diffusion layer. The source/drain metal can be, for example, nickel (Ni) or other typical contact metal, but in other cases such as those where voids in the contact diffusion layer are less tolerated, the source/drain metal can be, for example, titanium (Ti) or other refractory metal. The example method further includes patterning and etching to form the trench for the gate electrode. In general, the etch can involve wet and/or dry etches and can be targeted to stop near the quantum well interface. A spacer material, such as oxide or nitride, is then deposited along the gate trench wall/walls (generally referred to herein as gate trench sides, whether comprising a number of distinct sides in a polygonal-shaped trench or one continuous side in a circular-shaped trench), and etched to desired shape and thickness. In one example embodiment, an optional high-k gate dielectric can also be deposited to at the gate trench base of the gate trench to provided further isolation. Once the spacer and optional high-k dielectric are formed, the gate electrode metal such as nickel, aluminum (Al), titanium, or titanium nickel (TiN), can be deposited. The resulting formation includes low resistance source and drain contacts that are self-aligned to the transistor gate electrode, wherein the only space between the source/drain contacts and the gate electrode is occupied by the spacer material on the gate trench sides, in accordance with one embodiment of the present invention.

Note that the method may include other processing such as planarization, cleaning, and other such typical functionality not mentioned for purposes of brevity. Numerous process variations that employ blanket metallization and a gate trench spacer to facilitate self-alignment of low resistance drain and source contacts will be apparent in light of this disclosure. As will further be appreciated, the method can significantly improve external parasitic resistance and layout density, as well as process yields.

Quantum Well Structure

FIG. 1 illustrates an example quantum well growth structure for which low resistance self-aligned contacts can be formed, in accordance with one embodiment of the present invention. The quantum well growth structure can be, for example, a conventional InGaAs n-type quantum well structure with an n+ doped capping layer. As previously explained, however, note that low resistance self-aligned contacts formed in accordance with an embodiment of the present invention can be implemented with any number quantum well growth structures, such as n-channel metal oxide semiconductor (NMOS) or PMOS devices, as will be apparent in light of this disclosure. The claimed invention is not intended to be limited to any particular quantum well growth configuration.

As can be seen from the cross-section view of FIG. 1, the quantum well growth structure includes a substrate, upon which nucleation, buffer, and graded buffer layers are formed. The structure further includes a bottom barrier layer upon which a quantum well layer is formed, upon which a spacer layer is formed, upon which a doped layer is provided, upon which an upper barrier layer is provided. An etch stop layer is provided on the upper barrier layer, upon which the contact layer is provided. Each of these example layers will be discussed in turn. Other embodiments may include fewer layers (e.g., fewer buffer layers and/or no etch stop) or more layers (e.g., additional spacer and/or doped layers below quantum well layer, and/or capping layer on top of barrier layer to prevent oxidation) or different layers (e.g., formed with different semiconductor materials, formulations, and/or dopants). The layers may be implemented with any suitable layer thicknesses and other desired layer parameters, using established semiconductor processes (e.g., metal organic chemical vapor deposition, molecular beam epitaxy, photolithography, or other such suitable processes), and may be graded (e.g., in linear or step fashion) to improve lattice constant match between neighboring layers of otherwise lattice diverse materials. In general, the specific layers and dimensions of the structure will depend on factors such as the desired device performance, fab capability, and semiconductor materials used. Specific layer materials and characteristics are provided for example only, and are not intended to limit the claimed invention, which may be used with any number of layer materials and characteristics.

The substrate may be implemented as typically done, and any number of suitable substrate types and materials can be used here (e.g., p-type, n-type, neutral-type, silicon, gallium arsenide, silicon germanium, high or low resistivity, off-cut or not off-cut, silicon-on-insulator, etc). In one example embodiment, the substrate is a high resistivity n or p-type off-oriented silicon substrate. The substrate may have a vicinal surface that is prepared by off-cutting the substrate from an ingot, wherein substrate is off-cut at an angle between, for instance, 2° and 8° (e.g., 4° off-cut silicon). Such an off-cut substrate can be used to provide for device isolation and may also reduce anti-phase domains in anti-phase boundaries. Note, however, that the substrate need not have such specific features in other embodiments, and that quantum well growth structure can be implemented on numerous substrates.

The nucleation and bottom buffer layers are formed on the substrate, and also may be implemented as typically done. In one specific example embodiment, the nucleation and bottom buffer layers are made of gallium arsenide (GaAs) and have an overall thickness of about 0.5 to 2.0 µm (e.g., nucleation layer of about 25 nm to 50 nm thick and the bottom buffer layer is about 0.3 µm to 1 µm thick). As is known, the nucleation and bottom buffer layers can be used to fill the lowest substrate terraces with atomic bi-layers of, for example, III-V materials such as GaAs material. The nucleation layer can by used to create an anti-phase domain-free virtual polar substrate, and the bottom buffer layer may be used to provide dislocation filtering buffer that can provide compressive strain for a quantum well structure and/or control of the lattice mismatch between the substrate and the bottom barrier layer. Note that other quantum well structures that can benefit from an embodiment of the present invention may be implemented without the nucleation and/or bottom buffer layers.

The graded buffer layer is formed on the bottom buffer layer, and can also be implemented as conventionally done. In one specific example embodiment, the graded buffer layer is implemented with indium aluminum arsenide ($In_xAl_{1-x}As$) where x ranges from zero to 0.52, and has a thickness of about 0.7 to 1.1 µm. As is known, by forming the graded buffer layer, dislocations may glide along relatively diagonal planes therewithin so as to effectively control the lattice mismatch between the substrate and the bottom barrier layer. Note, however, that other embodiments may be implemented without a graded buffer, particularly those embodiments having a substrate and lower barrier layer that are implemented with materials having similar lattice constants (e.g., high indium content substrate such as indium phosphide and InAlAs barrier layer). As will be apparent, such graded layers can be used in other locations the quantum well structure or stack.

The bottom barrier layer is formed on the graded buffer layer in this example embodiment, and can also be implemented as conventionally done. In one specific example embodiment, the bottom barrier layer is implemented with indium aluminum arsenide (e.g., $In_{0.52}Al_{0.48}As$, or other suitable barrier layer formulation), and has a thickness in the range of 4 nm and 120 nm (e.g., 100 nm, +/−20 nm). Generally, the bottom barrier layer is formed of a material having a higher band gap than that of the material forming the overlying quantum well layer, and is of sufficient thickness to provide a potential barrier to charge carriers in the transistor channel. As will be appreciated, the actual make up and thickness of the bottom barrier layer will depend on factors such as the substrate and quantum well layer materials. Numerous such barrier materials and configurations can be used here, as will be appreciated in light of this disclosure.

The quantum well layer can also be implemented as conventionally done. In one specific example embodiment, the quantum well layer is implemented with indium gallium arsenide channel ($In_{0.7}Ga_{0.3}As$) formed on an aluminum arsenide (AlAs) channel, which is formed on an n++-

In$_{0.53}$Ga$_{0.47}$As channel formed on the bottom barrier layer, the channels having respective thicknesses of about 13 nm, 3 nm, and 100 nm (e.g., +/−20%). Numerous other quantum well layer configurations can be used here, as will be appreciated. In general, the quantum well is formed with a material having a smaller band gap than that of the lower barrier layer, can be doped or undoped, and is of a sufficient thickness to provide adequate channel conductance for a given application such as a transistor for a memory cell or a logic circuit. Further note that any number of channel configurations can be used, depending the desired performance. The quantum well layer may be strained by the bottom barrier layer, the upper barrier layer, or both.

The spacer layer is formed on the quantum well layer, and can also be implemented as conventionally done. In one specific example embodiment, the spacer layer is implemented with InAlAs (e.g., In$_{0.52}$Al$_{0.48}$As), and has a thickness in the range of 0.2 nm to 10 nm (e.g., 5 nm). In general, the spacer layer can be configured to provide compressive strain to the quantum well layer as it acts as a semiconductive channel. Note that other quantum well structures that can benefit from an embodiment of the present invention may be implemented without the spacer layer.

The doping layer is formed on the spacer layer in this example quantum well growth structure, and can also be implemented as conventionally done. In general, the lower barrier and/or upper barrier layers can be doped (by a corresponding doping layer) to supply carriers to the quantum well layer. In the example embodiment of FIG. 1, the upper barrier layer includes or is otherwise associated with a doped layer, and supplies carriers where the quantum well is undoped. The doping layer can be, for example, delta doped (or modulation doped). For an n-type device utilizing an InAlAs upper barrier, the doping may be implemented, for example, using silicon and/or tellurium impurities, and for a p-type device the doping layer may be implemented, for example, using beryllium and/or carbon. The thickness of the doping layer will depend on factors such as the type of doping and the materials used. For instance, in one example embodiment the doping layer is delta doped silicon and has a thickness between about 3 Å to 5 Å. In another embodiment, the doping layer is modulation doped and has a thickness between about 5 Å to 50 Å. The doping can be selected, for instance, based upon the sheet carrier concentration that is useful in the channel of the quantum well layer. An example concentration is $6 \times 10^{12}$ cm$^{-2}$ for a silicon doping layer, when doping inside the channel of the quantum well 120 is $3.5 \times 10^{12}$ cm$^{-2}$. As will be appreciated in light of this disclosure, an embodiment of the present invention may be implemented with quantum well structures having any type of doping layer or layers.

The upper barrier layer is formed on the doping layer in this example quantum well growth structure, and can also be implemented as conventionally done. In one specific example embodiment, the upper barrier layer is implemented with InAlAs (e.g., In$_{0.52}$Al$_{0.48}$As), and has a thickness of between 4 nm and 12 nm (e.g., 8 nm). The upper barrier layer may be a Schottky barrier layer for low voltage gate control, depending on the type of device being fabricated. In general, the upper barrier layer material has a larger band gap than that of the quantum well layer, thereby confining a majority of charge carriers within the quantum well layer for reduced device leakage. Note that the upper barrier layer may be formed of the same or different materials as the lower barrier layer. In some embodiments, the upper barrier layer can be implemented as a composite structure that includes the spacer, doping, and upper barrier layers. In addition, although this example embodiment associates the upper barrier with a doping layer, other embodiments may also (or alternatively) associate a doping layer with the lower barrier layer to supply carriers to the quantum well layer. In such cases, the doping layer associated with the bottom barrier layer can be implemented in a similar fashion to the doping layer associated with the upper barrier layer, and may also be implemented as a composite structure including spacer, doping, and lower barrier layers.

After formation of the device stack, which generally includes the substrate through the upper barrier layer as previously described, an etch stop layer can be formed over the upper barrier layer. In one specific example embodiment, the etch stop layer is implemented with indium phosphide (InP), and has a thickness in the range of 2 to 10 nm (e.g., 6 nm). As will be appreciated, other etch-stop structure materials may be used that may integrate with a given specific application rule.

The device stack is further processed by forming a contact layer above the etch stop layer. The contact layer generally allows for source and drain contact structures, and may be configured as n+ or n++ doped (for NMOS devices) or p+ or p++ (for PMOS devices). In one specific example embodiment, the contact layer is implemented as n++-In$_{0.53}$Ga$_{0.47}$As, and has a thickness in the range of 10 nm and 30 nm (e.g., 20 nm). In some cases, the contact layer may be doped by grading, starting for example with silicon doped with In$_{0.53}$Ga$_{0.47}$As, and proceeding from In$_x$Ga$_{1-x}$As from x=0.53 to 1.0 such that grading terminates with InAs. Again, the particular contact layer configuration provided will depend on a number of factors such as the semiconductor material system employed as well as the device type and desired device functionality.

Self-Aligned Contact Structure

FIGS. 2 through 8 illustrate with cross-sectional views the formation of a self-aligned contact structure in accordance with an embodiment of the present invention. As will be appreciated, the contacts (e.g., source, drain, and gate) can be formed on the device stack shown in FIG. 1, or any number of other quantum well growth structures. Note that intermediate processing, such as planarization (e.g., chemical mechanical polishing, or CMP) and subsequent cleaning processes, may be included throughout the formation process, even though such processing may not be expressly discussed.

Figure 2:
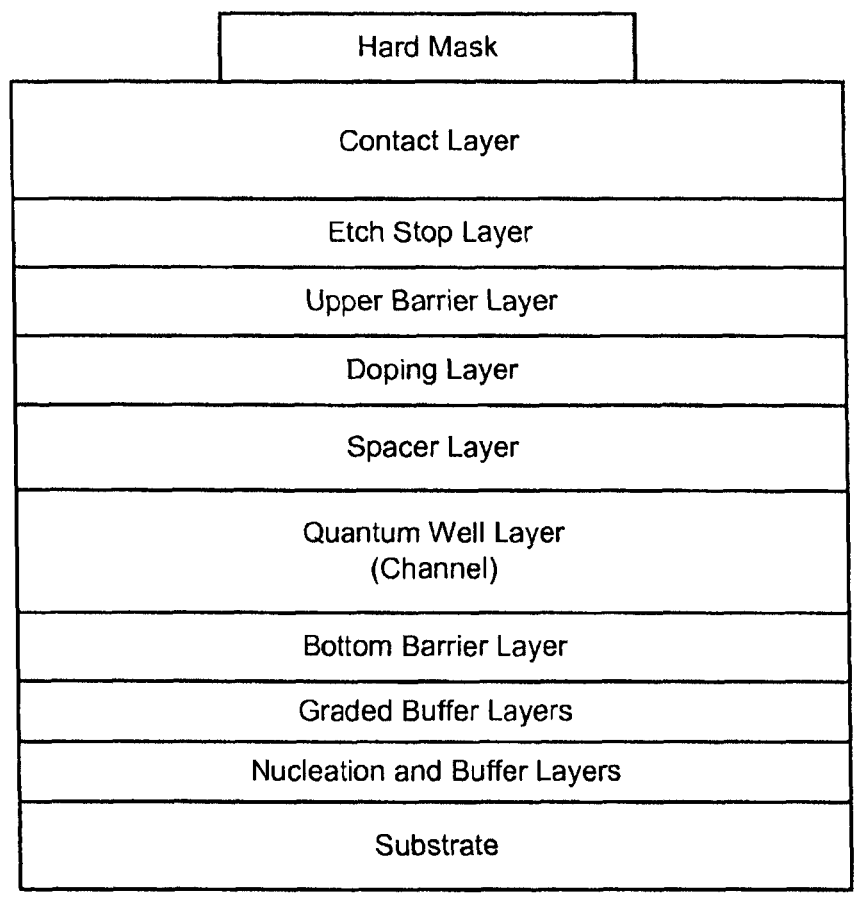
FIG. 2 illustrates deposition and patterning of a hardmask on the quantum well growth structure of FIG. 1, in accordance with one embodiment of the present invention.

FIG. 2 illustrates deposition and patterning of a hardmask on the stack of FIG. 1, in accordance with one embodiment of the present invention. This can be carried out using standard photolithography, including deposition of hardmask material (e.g., such as silicon dioxide, silicon nitride, and/or other suitable hardmask materials), patterning resist on a portion of the hardmask that will remain temporarily to protect an active region of the device during contact formation, etching to remove the unmasked (no resist) portions of the hardmask (e.g., using a dry etch, or other suitable hardmask removal process), and then stripping the patterned resist. In the example embodiment shown in FIG. 2, the resulting hardmask is central to the device stack and formed in one location, but in other embodiments, the hardmask may be offset to one side of the stack and/or located in multiple places on the stack, depending on the particular active device.

Figure 3:
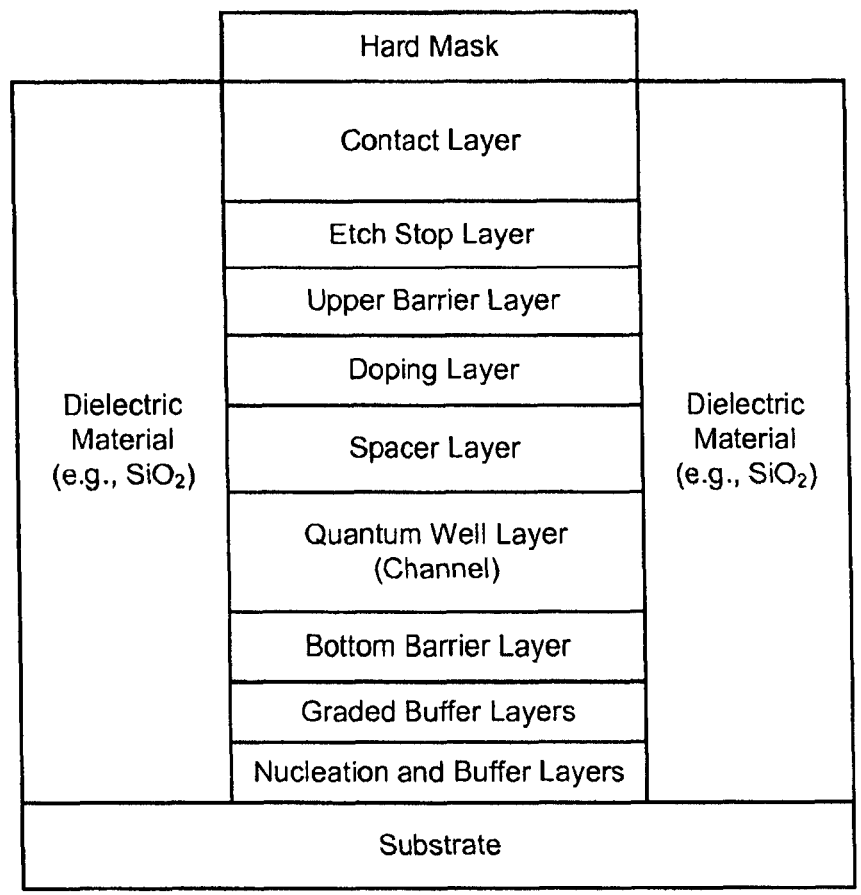
FIG. 3 illustrates formation of an isolated mesa in the quantum well growth structure of FIG. 2, in accordance with one embodiment of the present invention.

FIG. 3 illustrates formation of an isolated mesa of the quantum well growth structure of FIG. 2, in accordance with one embodiment of the present invention. This can also be carried out using standard photolithography, including etching to remove portions of the stack that are unprotected by the hardmask (e.g., dry etch), and deposition of a dielectric material (e.g., such as SiO$_2$, or other suitable dielectric materials such as carbon doped oxide, silicon nitride, organic polymers such as perfluorocyclobutane or polytetrafluoroethylene, fluorosilicate glass, and organosilicates such as silsesquioxane, siloxane, or organosilicate glass). The depth of the etch may vary, but in some example embodiments is in the range of 1000 Å to 5000 Å below the top surface of the stack and below the channel (thereby effectively also setting the thickness of the deposited dielectric material). In general, the etch should be to a sufficient depth that allows the quantum well channel to be electrically isolated (e.g., from neighboring componentry or other potential interference sources). After formation of the isolated mesa and deposition of dielectric material, the hardmask can be removed (e.g., dry or wet etch), and the mesa surface and deposited dielectric materials can be polished/planarized (e.g., using CMP). Note that this mesa isolation can be combined with a shallow trench isolation (STI) oxide formation step such as commonly used in a conventional silicon process, if applicable and so desired. Further note that if a mesa etch only flow is used, the mesa etch step can also be done later in the flow or even at the end of the flow.

Figure 4:
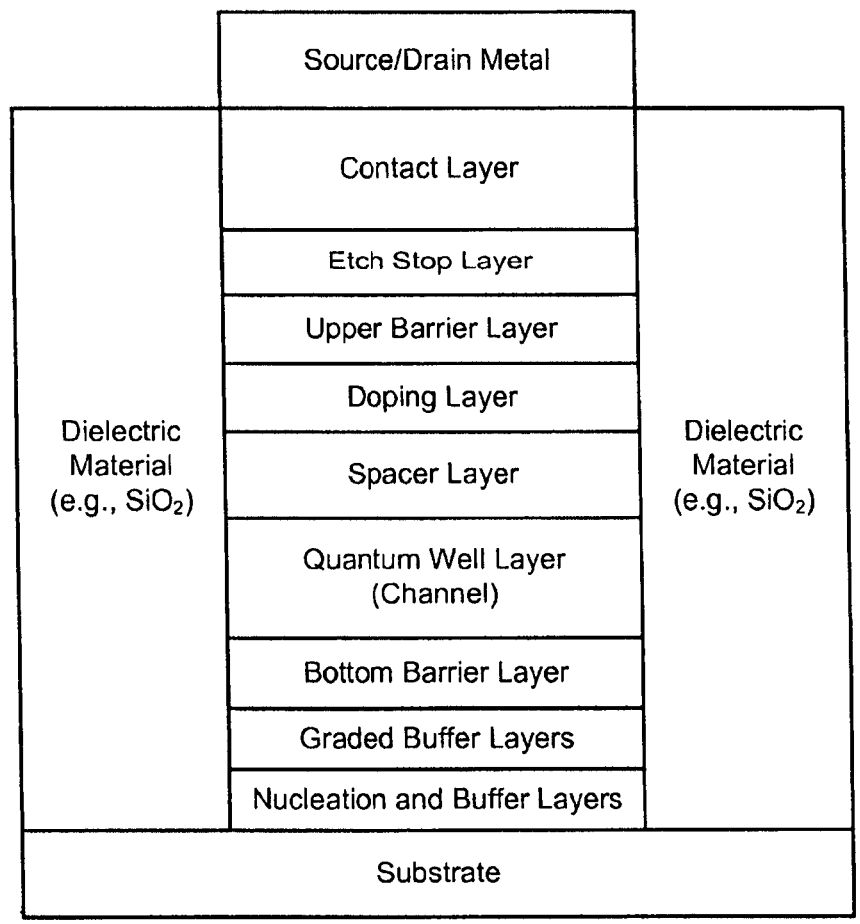
FIG. 4 illustrates deposition of source/drain metal on the mesa of the quantum well growth structure of FIG. 3, in accordance with one embodiment of the present invention.

FIG. 4 illustrates deposition of source/drain metal on the mesa of the quantum well growth structure of FIG. 3, in accordance with one embodiment of the present invention. This can be carried out using standard metal deposition processes, such as electron beam evaporation or reactive sputtering. The source/drain metal can be, for example, nickel, gold, platinum, aluminum, titanium, palladium, titanium nickel, or other suitable contact metal or alloy. The deposition can be masked, etched, polished, etc to provide the desired metallization layer from which the device source/drain contacts can be made.

In one example specific embodiment, assume the contact layer comprises germanium (Ge). In one such case, the source/drain metal may be thinly deposited nickel (e.g., in the range of 15 Å to 100 Å thick, such as about 25 Å). Such a NiGe contact may be suitable for large devices where diffusion voiding may not impede functioning of the device. However, for smaller devices, such a NiGe contact may be susceptible to problems associated with voids in the diffusion due to Ge out-diffusion during the alloying process. In such cases, and in accordance with an embodiment of the present invention, the deposited source/drain metal can be titanium (Ti) thereby providing a TiGe contact alloy formed on a Ge diffusion. In short, using Ti and/or other refractory metals for the source/drain metal on a Ge diffusion is helpful in eliminating or otherwise reducing voiding in the Ge diffusion and unwanted germanide formation outside transistor diffusion areas.

Figure 5:
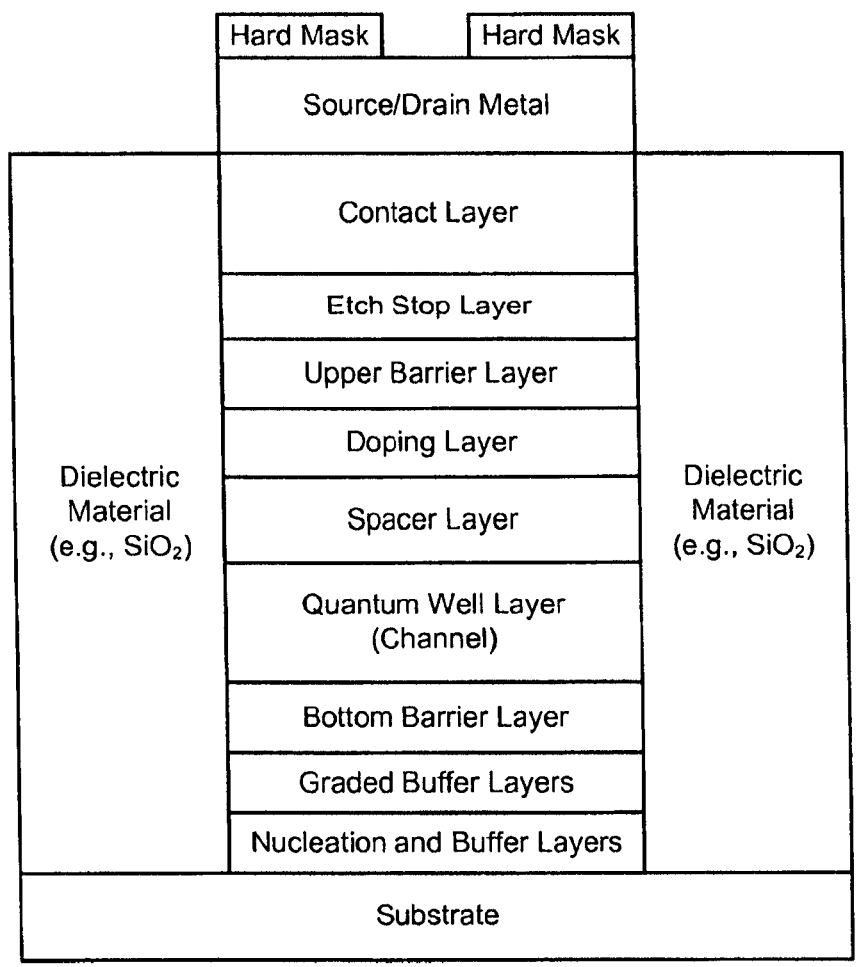
FIG. 5 illustrates deposition and patterning of a hardmask on the source/drain metal of the quantum well growth structure of FIG. 4, in accordance with one embodiment of the present invention.

FIG. 5 illustrates deposition and patterning of a hardmask on the source/drain metal of quantum well growth structure of FIG. 4, in accordance with one embodiment of the present invention. This hardmask is generally used to protect the metal contacts when the gate trench is etched. The deposition and patterning of a hardmask can be carried out using standard photolithography, including deposition of hardmask material (e.g., such as silicon dioxide, silicon nitride, and/or other suitable hardmask materials), patterning resist on a portion of the hardmask that will remain temporarily to protect the contacts of the device during gate etching, etching to remove the unmasked (no resist) portions of the hardmask (e.g., using a dry etch, or other suitable hardmask removal process), and then stripping the patterned resist. In the example embodiment shown in FIG. 5, the gate trench location is central to the device stack and formed in one location, but in other embodiments, the hardmask may be offset to one side of the stack and/or located in multiple places on the stack (e.g., for dual device configurations).

Figure 6:
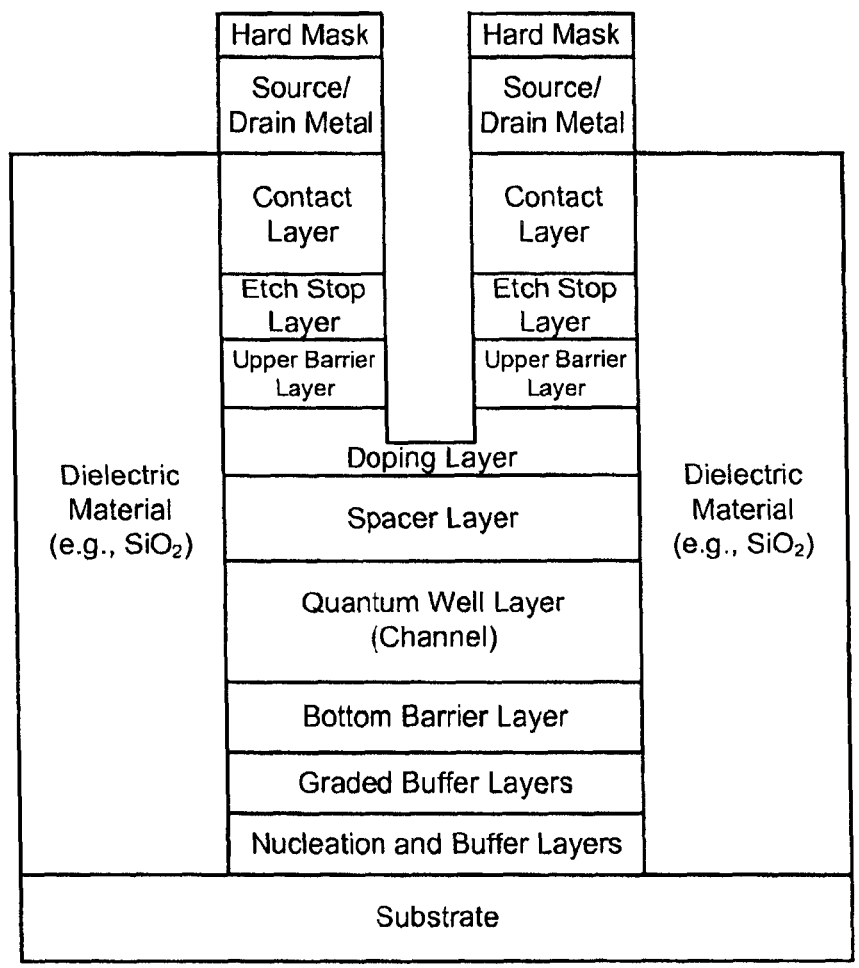
FIG. 6 illustrates formation of a gate trench in the quantum well growth structure of FIG. 5, in accordance with one embodiment of the present invention.

FIG. 6 illustrates formation of a gate trench in the quantum well growth structure of FIG. 5, in accordance with one embodiment of the present invention. This trench formation can be carried out, for example, using a first dry etch to etch the metal in the gate region, and a second dry etch to etch into the quantum well structure. The depth of the second dry etch can be targeted, for instance, to stop near the quantum well interface and may therefore stop, for instance, in the barrier layer, the doping layer, or the spacer layer. The depth of the gate trench may be, for example, in the range of 50 Å to 500 Å below the top surface of the stack (somewhere above the channel). In general, the second etch should be to a sufficient depth that allows for the desired device conduction. Once the gate trench is etched, the hardmask can then be stripped. Alternatively, the hardmask can be left in place until the gate metal has been deposited, if so desired.

Figure 7:
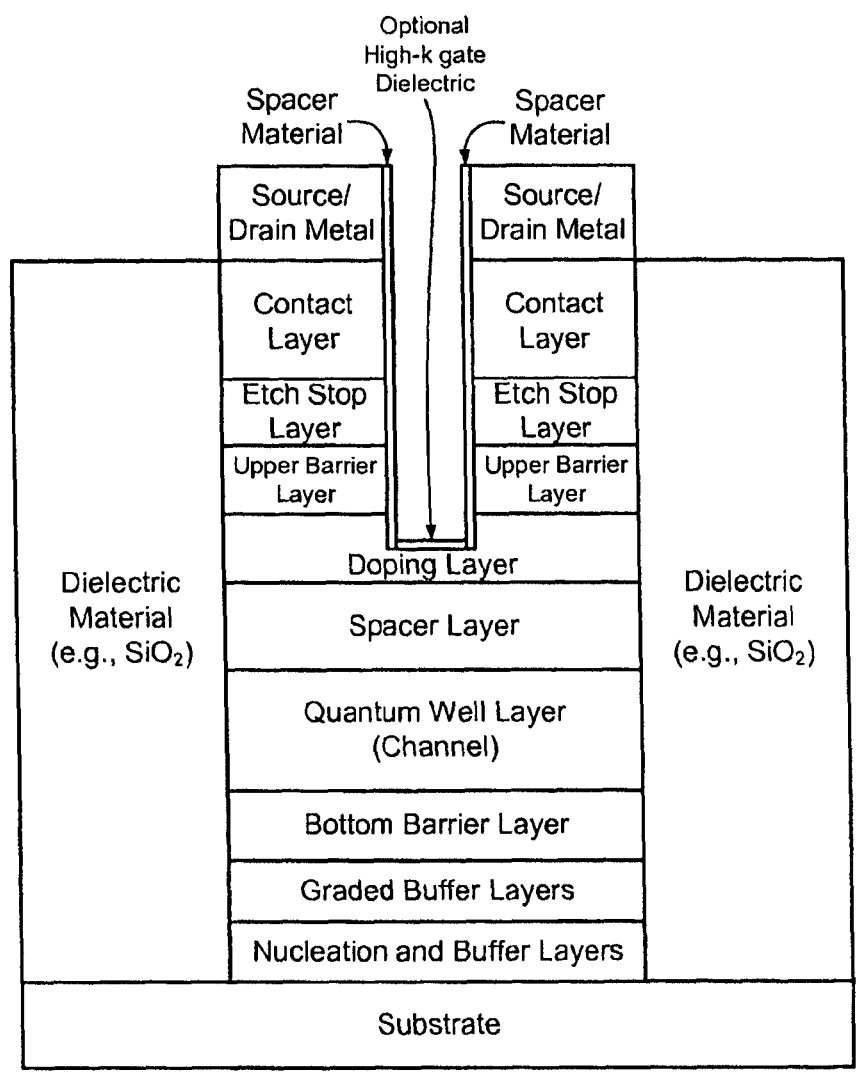
FIG. 7 illustrates formation of a spacer in the gate trench of the quantum well growth structure of FIG. 6, in accordance with one embodiment of the present invention.

FIG. 7 illustrates formation of a spacer in the gate trench of the quantum well growth structure of FIG. 6, in accordance with one embodiment of the present invention. The spacer layer, which can be an oxide or nitride or other suitable spacer material, can be deposited and etched using standard deposition and etch processes, and may have a thickness, for example, in the range of 20 Å to 200 Å (e.g., 100 Å). In general, the thickness of the spacer layer should be sufficient to electrically isolate the gate electrode from the neighboring source and drain contacts. Note that there is no open space between the source/drain contacts and the gate electrode; rather, there is the spacer layer separating the gate electrode from the source/drain contacts, thereby allowing for self-alignment among the neighboring elements. In one particular embodiment, an optional high-k gate dielectric can also be deposited in the base of the gate trench, if so desired, for further electrical insulation of the gate. The high-k gate dielectric can be, for instance, a film having a thickness in the range of 20 Å to 200 Å (e.g., 100 Å), and can be implemented, for instance, with hafnium oxide, alumina, tantalum pentaoxide, zirconium oxide, lanthanum aluminate, gadolinium scandate, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or other such materials having a dielectric constant greater than that of, for instance, silicon dioxide. An example of this optional high-k dielectric is shown in FIGS. 7 and 8.

Figure 8:
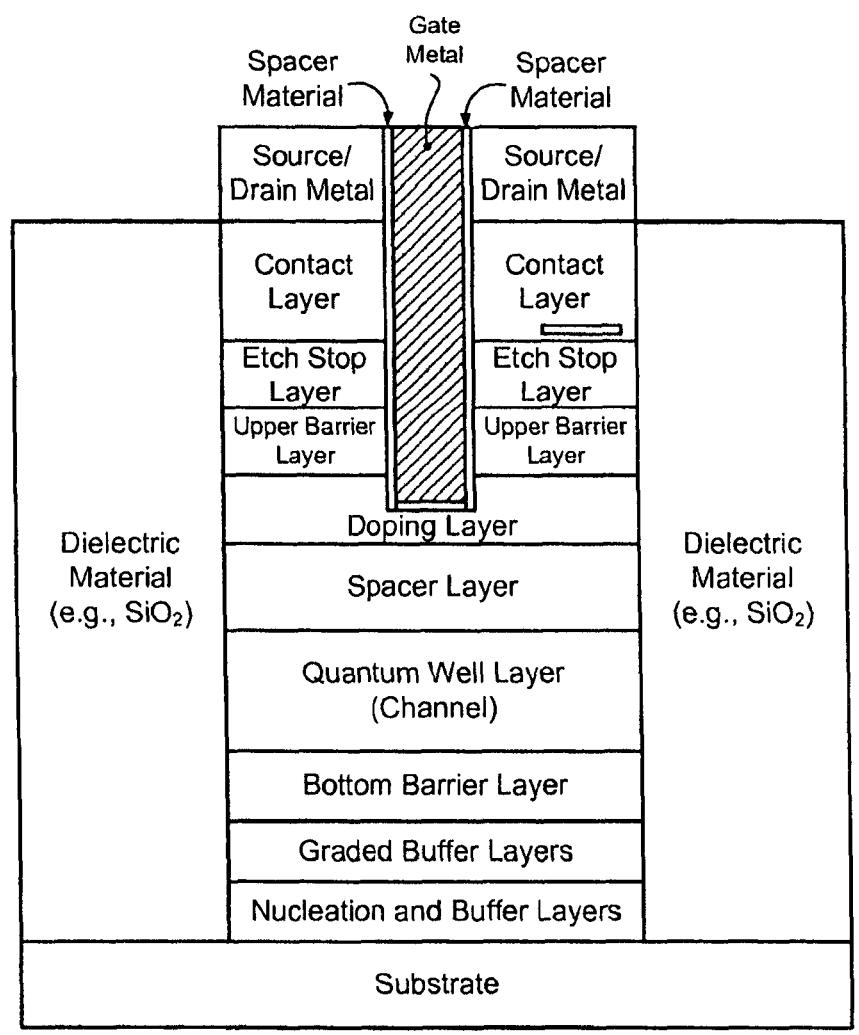
FIG. 8 illustrates deposition of a gate metal in the gate trench of the quantum well growth structure of FIG. 7, in accordance with one embodiment of the present invention.

FIG. 8 illustrates deposition of a gate metal in the gate trench of the quantum well growth structure of FIG. 7, in accordance with one embodiment of the present invention. As can be seen, the resulting gate electrode and source/drain contacts are self-aligned, in that there is no open air space between them. Rather, the adjoining spacer layer provides electrical isolation between the source/drain contacts and the gate electrode, but also provides for structural support during gate formation and self-alignment. The gate metal can be, for example, titanium, platinum, gold, aluminum, titanium nickel, palladium, or other suitable gate metal or combination of such metals. In one specific example embodiment, the gate electrode has a thickness from 50 Å to 500 Å (e.g., 100 Å).

The resulting integrated circuit device as illustrated can be used as a transistor that may be installed in any of several microelectronic devices, such as a central processing unit, memory array, on-chip cache, or logic gate. Likewise, numerous system level applications can employ integrated circuits as described herein.

Methodology

Figure 9:
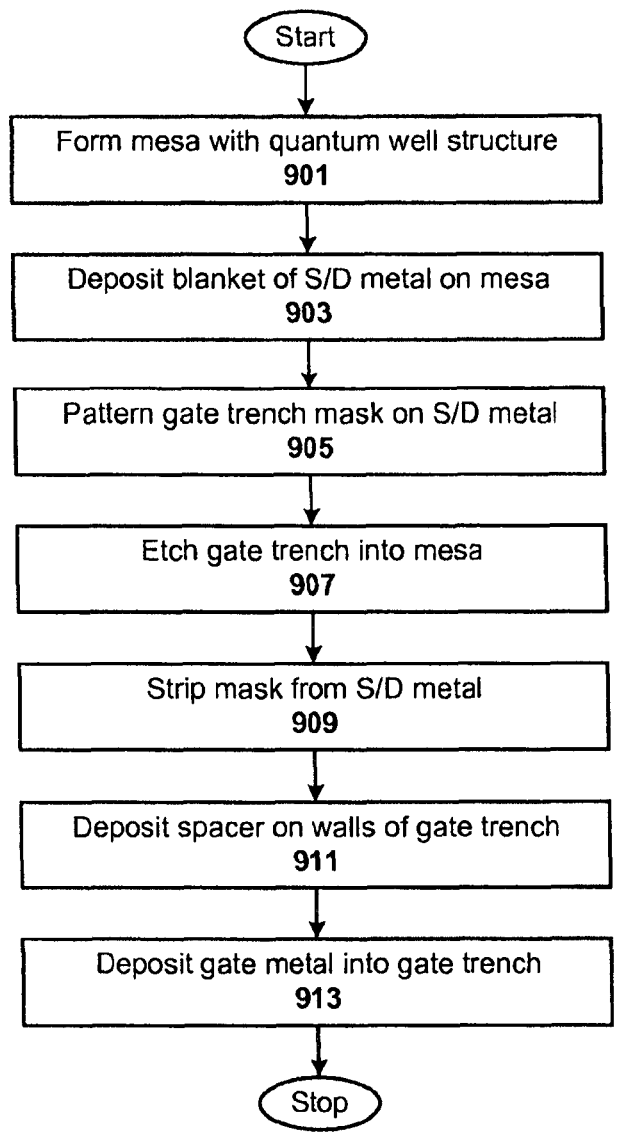
FIG. 9 illustrates a method for forming low resistance self-aligned contacts for a quantum well structure, in accordance with one embodiment of the present invention.

FIG. 9 illustrates a method for forming low resistance self-aligned contacts for a quantum well structure, in accordance with one embodiment of the present invention. The quantum well structure can be configured as desired, and generally includes a stack that may include a substrate, a quantum well layer between upper and lower barrier layers, and a contact layer.

The method includes forming 901 a mesa with the quantum well structure. The formation may include, for instance, patterning a hardmask on the contact layer to protect an active area of the structure, etching away the unmasked areas, and then depositing a dielectric material, thereby isolating a mesa. The method may further include polishing and cleaning processes, to prepare the structure for subsequent processing, as typically done between processing segments.

The method continues with depositing 903 a blanket of source/drain metal (e.g., nickel, titanium, nickel titanium, or any suitable contact metal, or a refractory metal) on the mesa, for forming the drain and source contacts. The depositing is done in a blanket fashion, in that the metal layer is a single continuous sheet, as opposed to a discrete and separate metal layer for each contact. The method may further include patterning the metallization and etching to further refine the metallization layer.

The method continues with patterning 905 a hardmask on the source/drain metal for forming the gate trench between the source and drain contacts. The patterning may include, for instance, deposition of hardmask material, patterning resist on a portion of the hardmask that will remain temporarily to protect the source and drain contacts of the device during gate etching, etching to remove the unmasked (no resist) portions of the hardmask (e.g., using a dry etch, or other suitable hardmask removal process), and then stripping the patterned resist. Note that etching the gate trench though the blanket metal layer effectively defines the source and drain contacts directly at respective sides of the gate trench, so that there is no open space between the source/drain contacts and the gate trench.

The method continues with etching 907 a gate trench into mesa, between the source and drain contact. In one example case, and as previously explained, the trench formation can be carried out using a first dry etch to etch the metal in the gate region, and a second dry etch to etch into the quantum well structure. The depth of the second dry etch can be selected so as to allow for the desired device conduction. After the gate trench is etched, the method may further include stripping 909 the hardmask from the source/drain metal, which may be done later in the process if so desired.

The method continues with depositing 911 spacer layer on sides of the gate trench, and optionally etching to shape (e.g., to thickness in the range of 10 Å to 500 Å). The spacer material can be any suitable dielectric to isolate the neighboring gate electrode and source/drain contacts, which will be self-aligned with respect to each other. Note that the gate trench may be circular or polygonal in nature, and reference to gate trench 'sides' is intended to refer to any such configurations, and should not be interpreted to imply a particular geometric shaped structure. For instance, 'sides' may refer to different locations on a circular-shaped trench or discrete sides of a polygonal-shaped trench or even different locations on one discrete side of a polygonal-shaped trench. Further recall the method may optionally include provisioning of a high-k gate dielectric layer in the base of the gate trench as well, for further electrical insulation of the gate, which may be formed before or after the spacer formation on the gate trench sides. The method continues with depositing 913 gate metal into gate trench. The gate metal can be, for example, nickel, titanium, titanium nickel, palladium, gold, aluminum, or other suitable gate metal or alloy.

Thus, the contacts described herein can be formed with numerous semiconductor heterostructures (such as III-V or SiGe/Ge systems). The process flow allows for forming low resistance source and drain contacts that are self-aligned to the transistor gate electrode, and significantly improves external parasitic resistance and layout density. The process flow may employ blanket metallization along with subsequent lithography and etching to pattern the metal into isolated source and drain regions, as well as a trench patterned gate process carried out towards the end of the process flow. The resulting gate electrode is self-aligned to the source/drain contacts and isolated via a spacer layer. In contrast, conventional contacts are not self-aligned, as there is significant space between the source/drain contacts and gate electrode, which also leads to a layout density penalty. Further, Rext increases as source/drain metal to gate spacing is increased.

Numerous embodiments and configurations will be apparent in light of this disclosure. For instance, one example embodiment of the present invention provides a method for forming self-aligned contacts for a quantum well structure. The method includes depositing a metal layer on the quantum well structure, and etching a gate trench through the metal layer, thereby defining source and drain contacts directly at respective sides of the gate trench. The method continues with depositing a spacer layer on sides of the gate trench, and depositing gate metal into the gate trench to form a gate electrode. The method may include forming a mesa with the quantum well structure. In one such case, forming a mesa with the quantum well structure includes patterning a hardmask on a contact layer of the quantum well structure to protect an active area, etching away unmasked areas of the quantum well structure, and depositing a dielectric material into etched areas. In another such case, forming a mesa with the quantum well structure is performed prior to depositing a metal layer on the quantum well structure. In another such case, forming a mesa with the quantum well structure is performed after the gate electrode, source contact, and drain contact are formed. Depositing a metal layer on the quantum well structure may include, for example, depositing a refractory metal. Depositing a metal layer on the quantum well structure may include, for instance, depositing titanium. Etching a gate trench through the metal layer may include, for example, a first dry etch to etch the metal layer, and a second dry etch to etch into the quantum well structure. The method may include depositing a high-k gate dielectric in base of the gate trench.

Another example embodiment of the present invention provides an integrated circuit device. The device includes a quantum well structure having a contact layer, and a metal layer deposited on the contact layer. The device further includes a gate trench through the metal layer, thereby defining source and drain contacts directly at respective sides of the gate trench. The device further includes a spacer layer on sides of the gate trench, and gate metal in the gate trench for a gate electrode. In one particular case, at least one of the source contact, drain contact, and gate electrode comprise a refractory metal. In another particular case, at least one of the source contact, drain contact, and gate electrode comprise titanium. In another particular case, the quantum well structure further includes a bottom barrier layer, a quantum well layer, a spacer layer, a doping layer, and an upper barrier layer. In one such case, the gate trench stops in one of the upper barrier layer, the doping layer, or the spacer layer. In another such case, a high-k gate dielectric layer is provided between the gate electrode and the quantum well structure. In one such case, the high-k gate dielectric layer is positioned directly between the gate electrode and one of the upper barrier layer, the doping layer, or the spacer layer.

Another example embodiment of the present invention provides an integrated circuit device. In this example, the device includes a quantum well structure having a bottom barrier layer, a quantum well layer, a spacer layer, a doping layer, an upper barrier layer, and a contact layer. The device further includes a metal layer deposited on the contact layer, and a gate trench through the metal layer, thereby defining source and drain contacts directly at respective sides of the gate trench, wherein the gate trench stops in one of the upper barrier layer, the doping layer, or the spacer layer. The device further includes a spacer layer on sides of the gate trench, gate metal in the gate trench for a gate electrode, and a high-k gate dielectric layer between the gate electrode and the quantum well structure. In one particular case, at least one of the source contact, drain contact, and gate electrode comprise a refractory metal. In another particular case, at least one of the source contact, drain contact, and gate electrode comprise titanium. In another particular case, the high-k gate dielectric layer is positioned directly between the gate electrode and one of the upper barrier layer, the doping layer, or the spacer layer.

Another example embodiment of the present invention provides an integrated circuit device. In this example, the device includes a quantum well structure having a contact layer. The device further includes a source metal layer and a drain metal layer deposited on the contact layer, and a gate electrode embedded within the quantum well structure between the source metal layer and the drain metal layer. The device further includes a first spacer layer formed between the gate electrode and the source metal layer, wherein the gate electrode is in physical contact with the first spacer layer and the first spacer layer is in physical contact with the source metal layer. The device further includes a second spacer layer formed between the gate electrode and the drain metal layer, wherein the gate electrode is in physical contact with the second spacer layer and the second spacer layer is in physical contact with the drain metal layer. Note that the first and second spacer layers can be one continuous spacer layer around the gate electrode. In one particular case, the quantum well structure further includes a bottom barrier layer, a quantum well layer, a spacer layer, a doping layer, and an upper barrier layer, and the gate electrode stops in one of the upper barrier layer, the doping layer, or the spacer layer. In another particular case, a high-k gate dielectric layer is provided between the gate electrode and the quantum well structure, wherein the high-k gate dielectric layer is positioned directly between the gate electrode and one of the upper barrier layer, the doping layer, or the spacer layer.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor device comprising:
a quantum well structure disposed above a substrate, said quantum well structure having, an upper barrier layer above a quantum well layer;
a trench, through said upper barrier layer disposed in said quantum well structure, and above said quantum well layer , said trench having sidewalls and a bottom;
source/drain metal regions disposed on the quantum well structure and on either side of said trench; a gate electrode disposed in said trench; and a dielectric material on the sidewalls of said trench and extending to the bottom of said trench wherein said dielectric material is between said gate electrode and said source/drain metal regions.

2. The semiconductor device of claim 1 wherein said quantum well structure comprises a bottom barrier layer, said quantum well layer disposed above said bottom barrier layer, a semiconductor spacer layer above said quantum well layer, a doping layer above said quantum well layer, and a contact layer above said upper barrier layer wherein said source/drain metal regions are disposed on said contact layer.

3. The semiconductor device of claim 2 wherein said bottom of said trench is in said doping layer.

4. The semiconductor device of claim 2 wherein said bottom of said trench is in said semiconductor spacer layer.

5. The semiconductor device of claim 1 wherein said dielectric material is between said source/drain metal regions and said gate electrode.

6. The semiconductor device of claim 1 wherein a gate dielectric layer is on the bottom of said trench and between said gate electrode and said quantum well structure.

7. The semiconductor device of claim 2 further comprising an etch stop layer.

8. The semiconductor device of claim 7 wherein said etch stop layer is InP.

* * * * *